(12) United States Patent
Chu et al.

(10) Patent No.: US 11,126,048 B2
(45) Date of Patent: Sep. 21, 2021

(54) ARRAY SUBSTRATE AND DISPLAY DEVICE

(71) Applicants: BOE TECHNOLOGY GROUP CO., LTD., Beijing (CN); Hefei BOE Optoelectronics Technology Co., Ltd., Anhui (CN)

(72) Inventors: Hao Chu, Beijing (CN); Yue Shi, Beijing (CN); Chuanbao Chen, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 614 days.

(21) Appl. No.: 15/776,455

(22) PCT Filed: Sep. 22, 2017

(86) PCT No.: PCT/CN2017/102952
§ 371 (c)(1),
(2) Date: May 16, 2018

(87) PCT Pub. No.: WO2018/153082
PCT Pub. Date: Aug. 30, 2018

(65) Prior Publication Data
US 2020/0272003 A1 Aug. 27, 2020

(30) Foreign Application Priority Data

Feb. 22, 2017 (CN) .......................... 201710096076.2

(51) Int. Cl.
G02F 1/1362 (2006.01)
G02F 1/1368 (2006.01)
H01L 27/12 (2006.01)

(52) U.S. Cl.
CPC ...... *G02F 1/136286* (2013.01); *G02F 1/1368* (2013.01); *H01L 27/124* (2013.01)

(58) Field of Classification Search
None
See application file for complete search history.

(56) References Cited

U.S. PATENT DOCUMENTS

2006/0290859 A1* 12/2006 Ko .................... G02F 1/136286
349/139
2009/0195489 A1* 8/2009 Hung ................ G02F 1/136286
345/92

(Continued)

FOREIGN PATENT DOCUMENTS

| CN | 101685606 A | 3/2010 |
| CN | 103676381 A | 3/2014 |

(Continued)

OTHER PUBLICATIONS

Search Report for International Application No. PCT/CN2017/102952 dated Dec. 28, 2017.

*Primary Examiner* — Bo B Jang
(74) *Attorney, Agent, or Firm* — Calfee, Halter & Griswold LLP

(57) ABSTRACT

An array substrate includes gate lines, data lines, and pixel units defined by adjacent gate lines and adjacent data lines, the gate lines, the data lines, and the pixel units being formed on a substrate, wherein the gate line gradually becomes wider from a driving start end to a driving terminal end. on the array substrate.

19 Claims, 3 Drawing Sheets

(56) References Cited

U.S. PATENT DOCUMENTS

2016/0266444 A1 9/2016 Zheng
2017/0004758 A1 1/2017 Son et al.

FOREIGN PATENT DOCUMENTS

| CN | 104252071 A | 12/2014 |
| CN | 106773422 A | 5/2017 |
| CN | 106783890 A | 5/2017 |

* cited by examiner

ARRAY SUBSTRATE AND DISPLAY DEVICE

CROSS-REFERENCE TO RELATED APPLICATIONS

The present application is based on International Application No. PCT/CN2017/102952, filed on Sep. 22, 2017, which is based upon and claims priority to Chinese Patent Application No. 201710096076.2, filed on Feb. 22, 2017, and the entire contents thereof are incorporated herein by reference.

TECHNICAL FIELD

The present disclosure relates to the field of display technology, and more particularly, to an array substrate and a display device.

BACKGROUND

With the continuous development of display technology, liquid crystal display technology is widely used in televisions, mobile phones and other display devices, and people are paying more and more attention to display effect of liquid crystal display devices.

However, when a liquid crystal display device is driven, if voltage at the start of the drive is higher than voltage at a drive terminal, display brightness of each pixel unit in the liquid crystal display device will be uneven, and the display effect of the liquid crystal display device will be poor.

SUMMARY

According to an aspect of the present disclosure, there is provided an array substrate, including gate lines, data lines, and pixel units defined by adjacent gate lines and adjacent data lines, the gate lines, the data lines, and the pixel units being formed on a substrate, wherein the gate lines gradually become wider from a driving start end to a driving terminal end.

In an implementation manner, directions of the driving start ends of two adjacent gate lines on the array substrate are opposite to each other.

In an implementation manner, directions of the driving start ends of two adjacent gate lines on the array substrate are the same.

In an implementation manner, a width of the gate line on the side of the driving terminal end is the same as a width of an original gate line.

In an implementation manner, each of the pixel units is connected to one gate line and one data line.

In an implementation manner, the pixel unit includes a pixel electrode, a common electrode, and a thin film transistor.

In an implementation manner, the thin film transistor is located at the upper left side, the lower left side, the upper right side, or the lower right side of the pixel unit.

In an implementation manner, a gate electrode of the thin film transistor is connected to the gate line, a source electrode of the thin film transistor is connected to the data line, and a drain electrode of the thin film transistor is connected to the pixel electrode.

In an implementation manner, the gate line and the data line are crossed and insulated from each other.

In an implementation manner, a material of the pixel electrode and the common electrode is indium tin oxide.

According to another aspect of the present disclosure, there is provided a display device including the above-described array substrate.

on the array substrate

BRIEF DESCRIPTION OF THE DRAWINGS

Various other advantages and benefits will become apparent to those skilled in the art by reading the detailed description of preferred embodiments below. The drawings are only for the purpose of illustrations of the preferred embodiments and are not intended to limit the present disclosure. Furthermore, like reference numerals denote like parts throughout the drawings, in which.

DETAILED DESCRIPTION

Figure 1:
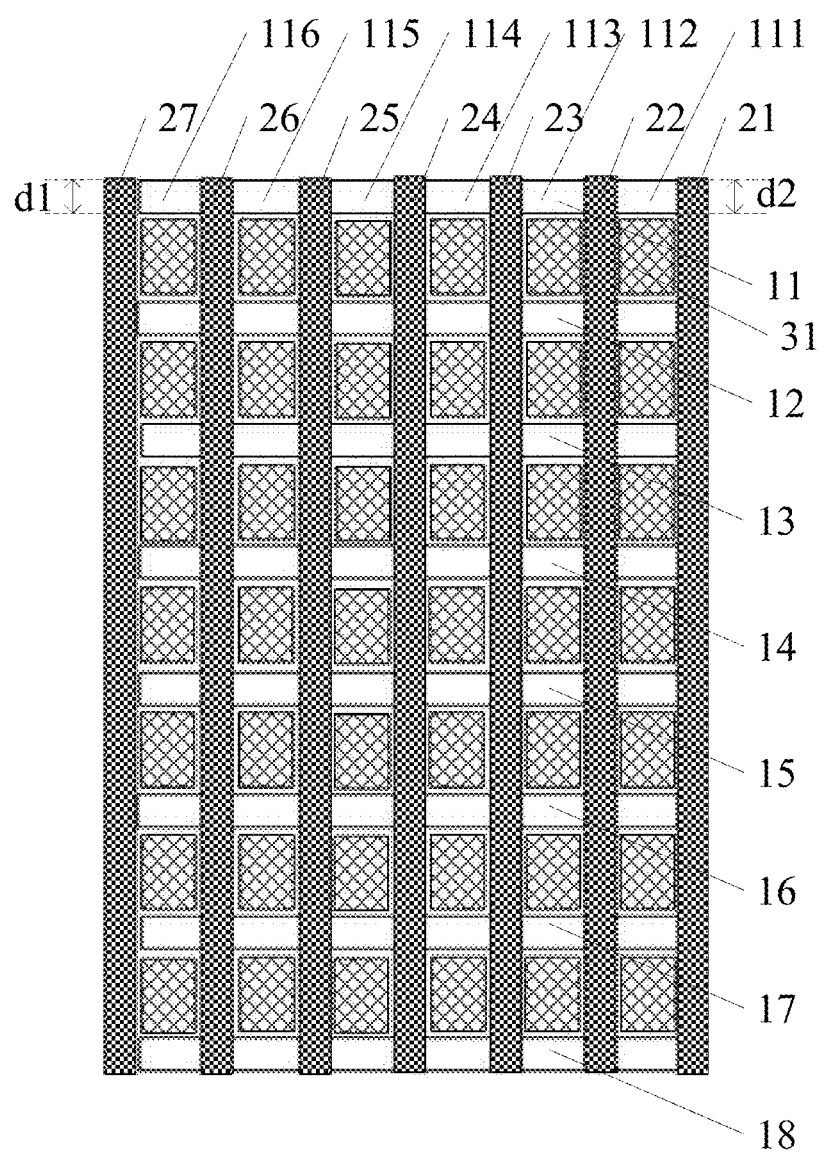
FIG. 1 is a structural schematic diagram illustrating a conventional array substrate.

Exemplary embodiments of the present disclosure will be described below in more detail with reference to the accompanying drawings. Although the exemplary embodiments of the present disclosure are illustrated in the drawings, it should be understood that the present disclosure may be implemented in various forms and should not be limited by the embodiments set forth herein. Rather, these embodiments are provided to better understand the present disclosure, and fully convey the scope of the present disclosure to those skilled in the art.

At present, in a liquid crystal display device, as shown in FIG. 1, an array substrate includes respective rows of gate lines, respective columns of data lines, and pixel units defined by adjacent gate lines and adjacent data lines, and a driving start end has a same width as that of a driving terminal end of the gate lines in the respective rows. The respective rows of gate lines include a gate line 11, a gate line 12, a gate line 13, a gate line 14, a gate line 15, a gate line 16, a gate line 17, and a gate line 18. The respective columns of data lines include a data line 21, a data line 22, a data line 23, a data line 24, a data line 25, a data line 26, and a data line 27. The respective rows of gate lines and the respective columns of data lines vertically are crossed and insulated one another, wherein areas of the gate line 11 blocked by the data lines in the respective columns vertically are crossed and insulated from the data lines in the respective columns. A gate line 111, a gate line 112, a gate line 113, a gate line 114, a gate line 115, a gate line 116, and the areas covered by the respective columns of data lines are all parts of the gate line 11. A pixel unit 31 is defined by the gate line 11, the gate line 12, the data line 21, and the data line 22. A width d1 of the gate line 11 on the left side is the same as a width d2 of the gate line 11 on the right side, that is, a driving start end of the gate line 11 has a same width as that of a driving terminal end of the gate line 11.

When adopting the prior art, the inventor has found that when an array substrate in the prior art uses gate lines with equal width to implement the driving of pixel units of a liquid crystal display device, since RC delay of a driving terminal end is greater than RC delay of a driving start end, the RC delay can also be referred to as gate delay, it will result in a corresponding increase in the loss of a gate signal corresponding to the gate line, and a higher voltage at the driving start end than voltage at the driving terminal end, thus display brightness of the pixel units in the liquid crystal display device is uneven, and the display effect of the liquid crystal display device is poor.

In order to solve the problems in the prior art, the present disclosure provides the following array substrate and display device.

The First Embodiment

Figure 2:
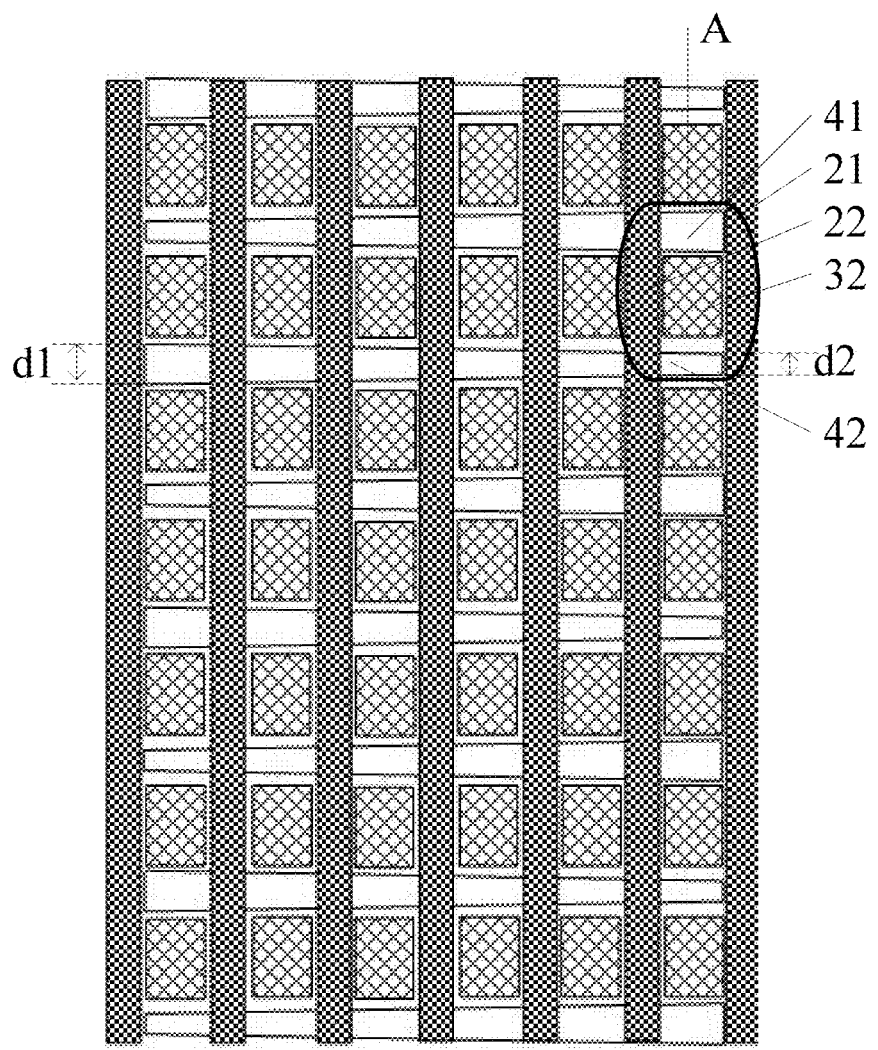
FIG. 2 is a structural schematic diagram illustrating an array substrate according to the present disclosure.

FIG. 2 is a structural schematic diagram of an array substrate according to the present disclosure.

The embodiment of the present disclosure provides an array substrate including a substrate, gate lines, data lines, and pixel units defined by adjacent gate lines and adjacent data lines, the gate lines, the data lines, and the pixel units being formed on the substrate, wherein a width of a driving start end of the gate line is smaller than a width of a driving terminal end thereof. In an implementation manner, the gate lines gradually become wider from the driving start end to the driving terminal end.

The array substrate includes a gate line 41, a gate line 42, a data line 21, a data line 22, and a pixel unit 32 defined by the adjacent gate lines 41 and 42 and the adjacent data lines 21 and 22. A width d1 of the gate line 42 on the left side is greater than a width d2 of the gate line 42 on the right side, and the gate line 42 drives the pixel units from right to left, that is, the width d2 of a driving start end of the gate line 42 is smaller than the width d1 of a driving terminal end thereof. An area A represents a partial schematic diagram of one pixel unit on the array substrate.

In the embodiment of the present disclosure, a control chip is disposed on both right and left sides of the array substrate, respectively, to provide a gate signal to each of the gate lines. A first control chip on the left side of the array substrate is used to provide a gate signal to the gate lines in even-numbered rows, and a second control chip on the right side of the array substrate is used to provide a gate signal for the gate lines in odd-numbered rows, at this time, the pixel units are driven from left to right by the gate lines in the even-numbered rows, and the pixel units are driven from right to left by the gate lines in the odd-numbered rows. Alternatively, the first control chip on the left side of the array substrate provides a gate signal to the gate lines in the odd-numbered rows, and the second control chip on the right side of the array substrate is used to provide a gate signal to the gate lines in the even-numbered rows, at this time, the pixel units are driven by the gate lines in the odd-numbered rows from left to right, and the pixel units are driven by the gate lines in the even-numbered rows from right to left, the embodiment of the present disclosure does not impose any limitation herein.

The pixel units are driven by the gate lines in the odd-numbered rows and the gate lines in even-numbered rows from the right and left sides, respectively, in this way, connection between the control chips on both sides and the gate lines is facilitated.

In an embodiment, the driving start ends of two adjacent gate lines are disposed on two opposite sides of the array substrate, respectively, so that directions of the driving start ends of the two adjacent gate lines on the array substrate are opposite to each other. That is, the two adjacent gate lines gradually become wider from directions opposite to each other. At present, the gate lines on the array substrate are arranged in rows. In an embodiment of the present disclosure, the gate lines on the array substrate can be arranged in rows, or in columns. When the gate lines on the array substrate are arranged in rows, the data lines on the array substrate are arranged in columns, and when the gate lines on the array substrate are arranged in columns, the data lines on the array substrate are arranged in rows, the embodiment of the present disclosure is not limited herein.

In another embodiment of the present disclosure, a control chip is provided on the left side or the right side of the array substrate for providing a gate signal to each of the gate lines. At this time, the driving start ends of two adjacent gate lines are respectively disposed on the same side of the array substrate, so that the directions of the driving start ends of the two adjacent gate lines on the array substrate are the same. That is, the two adjacent gate lines gradually become wider from the same direction. When the control chip is located on the left side of the array substrate, the driving start end is located on the left side of the gate lines, and when the control chip is provided on the right side of the array substrate, the driving start end is positioned on the right side of the gate lines. The driving start ends of the gate lines are connected with driving circuits disposed on the surrounding area of the array substrate.

Compared to the prior art, the present disclosure has the following advantages:

The array substrate of the embodiment of the present disclosure includes the gate lines, the data lines, and the pixel units defined by the adjacent gate lines and the adjacent data lines, the gate lines, the data lines, and the pixel units being formed on the substrate, wherein the gate lines are gradually widening from the driving start end to the driving terminal end. The width of the driving start end of the gate line is smaller than the width of the driving terminal end of the gate line on the array substrate, it results in that an impedance of the driving start end is greater than that of the driving terminal end, and a voltage difference between the driving start end and the driving terminal end, which is caused by a larger RC delay of the driving terminal end, is reduced, thereby solving the problem of uneven display brightness of the respective pixel units in a liquid crystal display device and poor display effect of the liquid crystal display device because of a higher voltage at the driving start end than a voltage at the driving terminal end. The use of the gate lines with unequal widths enhances evenness of the display brightness of the individual pixel units in the liquid crystal display device, increases the quality and yield of the liquid crystal display device, and improves the display effect of the liquid crystal display device.

The Second Embodiment

Figure 3:
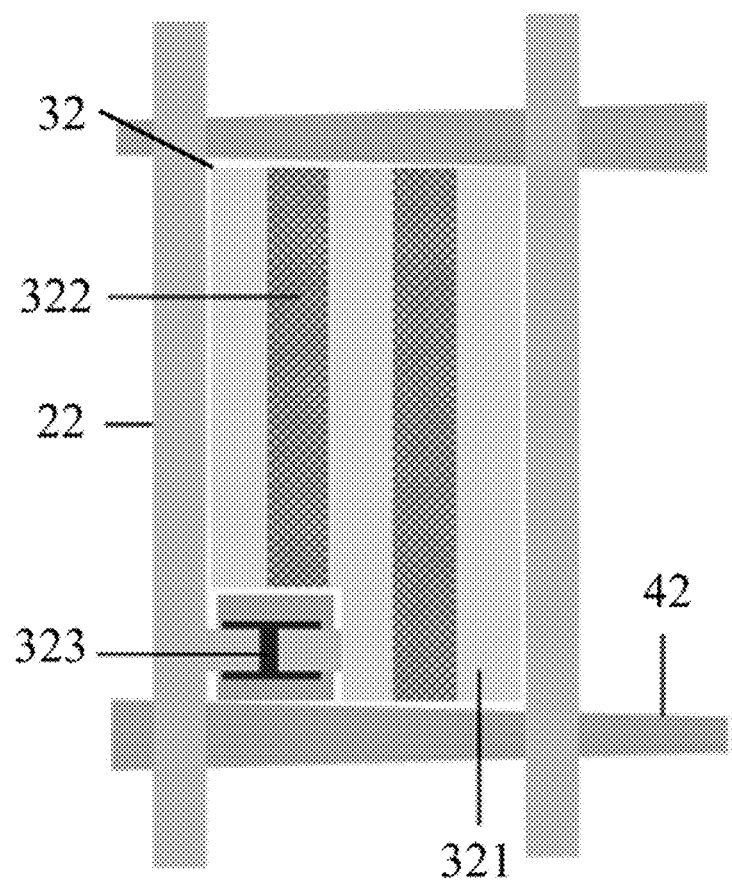
FIG. 3 is a structural schematic diagram illustrating one pixel unit in an array substrate according to the present disclosure.

FIG. 3 is a structural schematic diagram of a pixel unit in an array substrate according to the present disclosure.

FIG. 3 is a partial enlarged view of the area A in FIG. 2.

The embodiment of the present disclosure provides a pixel unit in an array substrate. Each of the pixel units 32 is connected to a gate line 42 and a data line 22. The gate line 42 and the data line 22 are crossed and insulated from each other, and the gate line 42 gradually becomes wider from a driving start end to a driving terminal end, wherein the pixel unit 32 includes a pixel electrode 321, a common electrode 322, and a thin film transistor 323.

In the embodiment of the present disclosure, the thin film transistor 323 can be disposed at the upper left side, the lower left side, the upper right side, or the lower right side of the pixel unit 32, which is convenient for connecting the thin film transistor and the corresponding gate line and data line, the embodiment of the present disclosure is not limited herein.

A gate electrode of the thin film transistor is connected to the gate line, a source electrode of the thin film transistor is connected to the data line, and a drain electrode of the thin film transistor is connected to the pixel electrode. A gate signal inputted through the gate line enables the thin film transistor to be turned on, and a data signal inputted through the data line enables the pixel electrode to be charged, and finally image display of the pixel unit in a liquid crystal display device is implemented.

A width of the gate line on the side of the driving terminal end is the same as a width of the original gate line, which is a width of the gate line currently existing on the array substrate, and when the width of the gate line on the side of the driving terminal end is the same as the width of the original gate line, a width of the gate line on the side of the driving start end can be decreased without affecting the size of the pixel unit.

A material of the pixel electrode and the common electrode is indium tin oxide. The indium tin oxide has excellent electrical conductivity and can improve the electrical conductivity of the array substrate. The indium tin oxide can also be described as ITO (indium tin oxide).

In the embodiment of the present disclosure, the pixel electrode is located on a rear glass substrate of the array substrate, the common electrode is positioned on a front glass substrate of the array substrate, and a liquid crystal is filled between the front glass substrate and the rear glass substrate. The thin film transistor is turned on by the gate signal in the gate line, the data signal in the data line is transferred to the drain electrode of the thin film transistor through the source electrode of the thin film transistor, and the drain electrode of the thin film transistor is connected to the pixel electrode of the pixel unit, the data signal outputted from the drain electrode of the thin film transistor supplies a voltage to the pixel electrode of the pixel unit, thus an electric field is produced between the pixel electrode and the common electrode, and the liquid crystal between the pixel electrode and the common electrode is controlled to be arranged in order so as to realize the display of the pixel units in the liquid crystal display device.

The voltage of the pixel electrode is related to the gate signal and the data signal. When the data signals are the same, the voltage of the pixel electrode is proportional to the magnitude of the gate signal. As a magnitude of the gate signal becomes larger, an opening degree of the thin film transistor becomes larger, a voltage of the pixel electrode becomes larger, and display brightness of the corresponding pixel unit becomes higher; and as the magnitude of the gate signal becomes smaller, the opening degree of the thin film transistor becomes smaller, the voltage of the pixel electrode becomes smaller, and the display brightness of the corresponding pixel unit becomes lower. When a difference value among the gate signals corresponding to the respective pixel units is smaller, the display brightnesses of the pixel units are more similar, and the display brightness of the pixel units in the liquid crystal display device are more uniform. In an implementation manner, when the magnitudes of the gate signals corresponding to the respective pixel units are the same, the display brightnesses of the pixel units in the liquid crystal display device are more uniform.

Compared to the prior art, the present disclosure has the following advantages:

Each of the pixel units on the array substrate of the embodiment of the present disclosure is connected with one gate line and one data line, and the gate lines gradually become wider from the driving start end to the driving terminal end. The width of the driving start end of the gate line on the array substrate is smaller than the width of the driving terminal end thereof, it results in that an impedance of the driving start end is greater than that of the driving terminal end, and a voltage difference between the driving start end and the driving terminal end, which is caused by a large RC delay of the driving terminal end, is reduced, thereby solving the problem of non-uniform display brightness of the respective pixel units in a liquid crystal display device and poor display effect of the liquid crystal display device because that the driving start end has a higher voltage than that of the driving terminal end. The use of the gate lines having unequal widths increases uniformity of the display brightness of the individual pixel units in the liquid crystal display device, improves the quality and yield as well as the display effect of the liquid crystal display device.

The Third Embodiment

An embodiment of the present disclosure provides a display device including the above-described array substrate.

The array substrate includes gate lines, data lines, and pixel units defined by adjacent gate lines and adjacent data lines, the gate lines, the data lines, and the pixel units being formed on a substrate, wherein the gate lines gradually become wider from a driving start end to a driving terminal end. Directions of the driving start ends of the two adjacent gate lines on the array substrate are opposite or the same. A width of the gate line on the side of the driving terminal end is the same as a width of the original gate line.

Each of the pixel units is connected to a gate line and a data line. The gate line and the data line are crossed and insulated from each other, and the gate lines gradually become wider from the driving start end to the driving terminal end, wherein the pixel unit includes a pixel electrode, a common electrode, and a thin film transistor. A gate electrode of the thin film transistor is connected to the gate line, a source electrode of the thin film transistor is connected to the data line, and a drain electrode of the thin film transistor is connected to the pixel electrode. The thin film transistor is located at the upper left side, the lower left side, the upper right side, or the lower right side of the pixel unit. A material of the pixel electrode and the common electrode is indium tin oxide.

In the embodiment of the present disclosure, a control chip separates corresponding row driving signal and column driving signal according to data and a clock signal inputted from a main board circuit, and respectively outputs them to the corresponding gate lines and data lines according to row and column arrangement of the gate lines and the data lines on the array substrate, and then provide corresponding gate signal and data signal to the gate lines and the data lines, the gate signal in the gate line enables the thin film transistor to be turned on, and the data signal through the data line enables the pixel electrode to be charged, in this way, an electric field is generated between the pixel electrode and the common electrode, the liquid crystal between the pixel electrode and the common electrode is controlled to be arranged in an order, so as to realize the display of the pixel units in the liquid crystal display device.

The display device may be any product or component having a display function such as a liquid crystal panel, a mobile phone, a tablet computer, a television, a monitor, a notebook computer, a navigator, and the like.

Compared to the prior art, the present disclosure has the following advantages:

The display device of the embodiment of the present disclosure includes the array substrate, wherein the gate lines on the array substrate are gradually widening from the driving start end to the driving terminal end. The width of the driving start end of the gate line is smaller than the width of the driving terminal end of the gate line on the array substrate, it results in that an impedance of the driving start end is greater than that of the driving terminal end, and a voltage difference between the driving start end and the driving terminal end, which is caused by a larger RC delay of the driving terminal end, is reduced, thereby solving the problem of uneven display brightness of the respective pixel units in a liquid crystal display device and poor display effect of the liquid crystal display device because of a higher voltage at the driving start end than a voltage at the driving terminal end. The use of the gate lines with unequal widths enhances evenness of the display brightness of the individual pixel units in the liquid crystal display device, increases the quality and yield of the liquid crystal display device, and improves the display effect of the liquid crystal display device.

Algorithm and display provided herein are not inherently related to any particular computer, virtual system, or other device. Various general-purpose systems can be used together based on the teaching herein. According to the above-mentioned description, structures required for constructing these systems will be apparent. In addition, the present disclosure is not directed to any particular programming language. It should be understood that the contents of the present disclosure described herein may be implemented using various programming languages, and the above description of a specific language is intended to disclose the best mode of the present disclosure.

In the description provided herein, a great deal of concrete details has been explained. However, it may be understood that the embodiments of the present disclosure can be practiced without these specific details. In some instances, well-known methods, structures, and techniques have not been shown in detail in order not to obscure the understanding of this description.

Similarly, it should be understood that in order to streamline the present disclosure and help understanding one or more of the inventive aspects, various features of the present disclosure are sometimes grouped together into a single embodiment, figure, or description thereof in the above description of the exemplary embodiments of the present disclosure. However, the method of this disclosure should not be interpreted as reflecting an intention that the claimed invention requires more features than those specifically recited in each of the claims. Rather, as the following claims reflecting, inventive aspects lie in not more than all of the features of a single embodiment disclosed above. Thus, the claims following the detailed embodiments are hereby expressly incorporated into the detailed embodiments, with each of the claims serving as a separate embodiment of the present disclosure.

The preferred embodiments of the present disclosure have been described in detail above. However, the present disclosure is not limited to the specific details in the above embodiments, and various simple variations of the technical solutions of the present disclosure may be made within the scope of the technical concept of the present disclosure, and the simple variations fall within the protection scope of the present disclosure. In addition, it should be noted that the respective specific technical features described in the above specific embodiments can be combined in any suitable manner without conflict. To avoid unnecessary repetition, various possible combination manners will not be further described in the present disclosure. In addition, any combination of various embodiments of the present disclosure may also be performed as long as it does not violate the idea of the present disclosure, and it should also be regarded as the contents disclosed in the present disclosure.

Furthermore, those skilled in the art may understand that although some embodiments described herein include some features included in other embodiments rather than other features, a combination of features of different embodiments is meant to be within the scope of the present disclosure and to form different embodiments. For example, in the following claims, any of the claimed embodiments can be used in any combination.

It should be noted that the above-mentioned embodiments are provided to illustrate the present disclosure but do not limit the present disclosure, and those skilled in the art can design alternative embodiments without departing from the scope of the appended claims. In the claims, reference signs placed between parentheses shall not be construed as limiting the claims. The term "comprising" does not exclude the presence of elements or steps not listed in the claims. The term "a" or "an" preceding an element does not exclude the presence of a plurality of such elements. The present disclosure may be implemented by means of hardware including several different elements and by means of a suitably programmed computer. In a unit claim wherein several devices are enumerated, some of these devices may be embodied by the same one hardware. The use of terms "first", "second", and "third", etc. do not denote any order. These terms can be interpreted as names.

What is claimed is:

1. An array substrate, comprising:
a substrate;
gate lines, data lines, and pixel units defined by adjacent gate lines and adjacent data lines, the gate lines, the data lines, and the pixel units being formed on the substrate,
wherein a width of a driving start end of each of the gate lines is smaller than a width of a driving terminal end of the corresponding gate line, an impedance of the driving start end of each of the gate lines is greater than that of the driving terminal end of the corresponding gate line, from the driving start ends to the driving terminal ends, a width of each of the date lines remains unchanged and a size of each of the pixel units remains unchanged.

2. The array substrate according to claim 1, wherein the gate lines gradually become wider from the driving start ends to the driving terminal ends.

3. The array substrate according to claim 1, wherein the driving start ends of two adjacent gate lines on the array substrate are respectively disposed on two opposite sides of the array substrate.

4. The array substrate according to claim 1, wherein the driving start ends of two adjacent gate lines on the array substrate are disposed on a same side of the array substrate.

5. The array substrate according to claim 1, wherein each of the pixel units is connected to one gate line and one data line.

6. The array substrate according to claim 5, wherein each of the pixel units comprises a pixel electrode, a common electrode, and a thin film transistor.

7. The array substrate according to claim 6, wherein each of the thin film transistors is located at an upper left side, a lower left side, an upper right side, or a lower right side of the corresponding pixel unit.

8. The array substrate according to claim 7, wherein a gate electrode of each of the thin film transistors is connected to the corresponding gate line, a source electrode of each of the thin film transistors is connected to the corresponding data line, and a drain electrode of each of the thin film transistors is connected to the corresponding pixel electrode.

9. The array substrate according to claim 8, wherein each of the gate lines and each of the data lines are crossed and insulated from each other.

10. The array substrate according to claim 6, wherein a material of each of the pixel electrodes and each of the common electrodes is indium tin oxide.

11. A display device comprising the array substrate according to claim 1.

12. The display device according to claim 11, wherein the gate lines gradually become wider from the driving start ends to the driving terminal ends.

13. The display device according to claim 11, wherein directions of the driving start ends of the two adjacent gate lines on the array substrate are opposite to each other.

14. The display device according to claim 11, wherein directions of the driving start ends of the two adjacent gate lines on the array substrate are the same.

15. The display device according to claim 11, wherein each of the pixel units is connected to one gate line and one data line.

16. The display device according to claim 15, wherein each of the pixel units comprises a pixel electrode, a common electrode, and a thin film transistor.

17. The display device according to claim 16, wherein each of the thin film transistors is located at an upper left side, a lower left side, an upper right side, or a lower right side of the pixel unit.

18. The display device according to claim 17, wherein a gate electrode of each of the thin film transistors is connected to the corresponding gate line, a source electrode of each of the thin film transistors is connected to the corresponding date line, and a drain electrode of each of the thin film transistors is connected to the corresponding pixel electrode.

19. The display device according to claim 18, wherein each of the gate lines and each of the data lines are crossed and are insulated from each other.

* * * * *